(12) United States Patent  
Armstrong et al.

(10) Patent No.: US 9,299,498 B2
(45) Date of Patent: Mar. 29, 2016

(54) MINIATURE WIRE-BONDABLE CAPACITOR

(71) Applicant: Eulex Corp., Pasadena, CA (US)

(72) Inventors: Euan Patrick Armstrong, Pasadena, CA (US); Ali Moalemi, San Diego, CA (US)

(73) Assignee: Eulex Corp., Pasadena, CA (US)

( * ) Notice: Subject to any disclaimer, the term of this patent is extended or adjusted under 35 U.S.C. 154(b) by 0 days.

(21) Appl. No.: 14/010,590

(22) Filed: Aug. 27, 2013

(65) Prior Publication Data

US 2014/0133065 A1 May 15, 2014

Related U.S. Application Data

(60) Provisional application No. 61/726,997, filed on Nov. 15, 2012, provisional application No. 61/822,352, filed on May 11, 2013.

(51) Int. Cl.

| | |
|---|---|
| *H01G 4/38* | (2006.01) |
| *H01G 4/30* | (2006.01) |
| *H01G 4/232* | (2006.01) |
| *H05K 3/32* | (2006.01) |
| *H01G 4/012* | (2006.01) |

(52) U.S. Cl.
CPC .............. *H01G 4/385* (2013.01); *H01G 4/232* (2013.01); *H01G 4/30* (2013.01); *H05K 3/328* (2013.01); *H01G 4/012* (2013.01); *H05K 2201/10015* (2013.01); *H05K 2203/049* (2013.01); *Y10T 29/4913* (2015.01)

(58) Field of Classification Search
CPC ....... H01G 4/385; H01G 4/30; H01G 4/4232; H01G 4/012; H05K 2203/049

USPC ................... 361/303, 306.3, 321.2
See application file for complete search history.

(56) References Cited

U.S. PATENT DOCUMENTS 4,568,999 A    2/1986 Larowe et al.
5,144,526 A *  9/1992 Vu et al. ............... 361/321.1
(Continued)

FOREIGN PATENT DOCUMENTS

JP    2000133544 A  *  5/2000
WO   2014078073 A1    5/2014

OTHER PUBLICATIONS

International Preliminary Report on Patentability for International Application No. PCT/US2013/067375, Report issued Oct. 30, 2014, Mailed Nov. 7, 2014, 10 Pgs.

(Continued)

*Primary Examiner* — David M Sinclair
(74) *Attorney, Agent, or Firm* — KPPB LLP

(57) ABSTRACT

A multi-layer ceramic capacitor (MLCC) device includes a ceramic chip having electrically conductive layers embedded within the chip that form one or more capacitors connected by one or more vias to one or more upwardly facing wire-bondable pads on the top side of the device. One embodiment includes electrically conductive layers that form at least two stacked capacitors connected by vias to multiple upwardly facing wire-bondable pads on the top side, whereby the MLCC device has a reduced footprint while avoiding solder fillets. The wire-bondable pads may lie in a common plane or be pyramidally stepped. Metallization on the PCB-facing bottom side and at least one of the ends of the ceramic chip of another embodiment forms a downwardly facing capacitor terminal.

9 Claims, 10 Drawing Sheets

(56) References Cited

U.S. PATENT DOCUMENTS

| | | | | |
|---|---|---|---|---|
| 5,745,335 | A * | 4/1998 | Watt | 361/313 |
| 5,757,611 | A * | 5/1998 | Gurkovich et al. | 361/321.4 |
| 6,452,781 | B1 * | 9/2002 | Ahiko et al. | 361/321.2 |
| 6,532,143 | B2 * | 3/2003 | Figueroa et al. | 361/301.4 |
| 6,606,237 | B1 * | 8/2003 | Naito et al. | 361/306.3 |
| 6,724,611 | B1 * | 4/2004 | Mosley | 361/306.3 |
| 6,751,082 | B2 * | 6/2004 | Devoe et al. | 361/321.2 |
| 6,906,910 | B1 * | 6/2005 | Gilliland et al. | 361/328 |
| 6,961,231 | B1 * | 11/2005 | Alexander et al. | 361/321.2 |
| 7,149,072 | B2 * | 12/2006 | Lee et al. | 361/307 |
| 7,312,975 | B2 * | 12/2007 | Togashi et al. | 361/321.1 |
| 7,511,939 | B2 * | 3/2009 | Wilson et al. | 361/306.2 |
| 7,710,710 | B2 * | 5/2010 | Brunner et al. | 361/306.3 |
| 8,008,161 | B2 * | 8/2011 | Bachmann et al. | 438/396 |
| 8,102,223 | B2 * | 1/2012 | Umemoto et al. | 333/185 |
| 8,369,064 | B2 * | 2/2013 | Ichiyanagi et al. | 361/311 |
| 8,395,881 | B2 * | 3/2013 | Togashi | 361/306.3 |
| 2003/0063427 | A1 * | 4/2003 | Kunihiro | H01F 17/0006 361/277 |
| 2003/0161090 | A1 | 8/2003 | Devoe et al. | |
| 2005/0207093 | A1 | 9/2005 | Togashi et al. | |
| 2006/0092594 | A1 | 5/2006 | Hwang et al. | |
| 2006/0198079 | A1 * | 9/2006 | Shim et al. | 361/306.3 |
| 2009/0128993 | A1 | 5/2009 | Wu et al. | |
| 2011/0024171 | A1 * | 2/2011 | Nakamura et al. | 174/258 |
| 2012/0039016 | A1 | 2/2012 | Togashi | |
| 2012/0327554 | A1 | 12/2012 | Moalemi et al. | |
| 2013/0038981 | A1 | 2/2013 | Imanaka et al. | |

OTHER PUBLICATIONS

International Search Report for International Application No. PCT/US2013/067375, Search completed Mar. 10, 2014, Mailed Mar. 27, 2014, 2 Pgs.

* cited by examiner

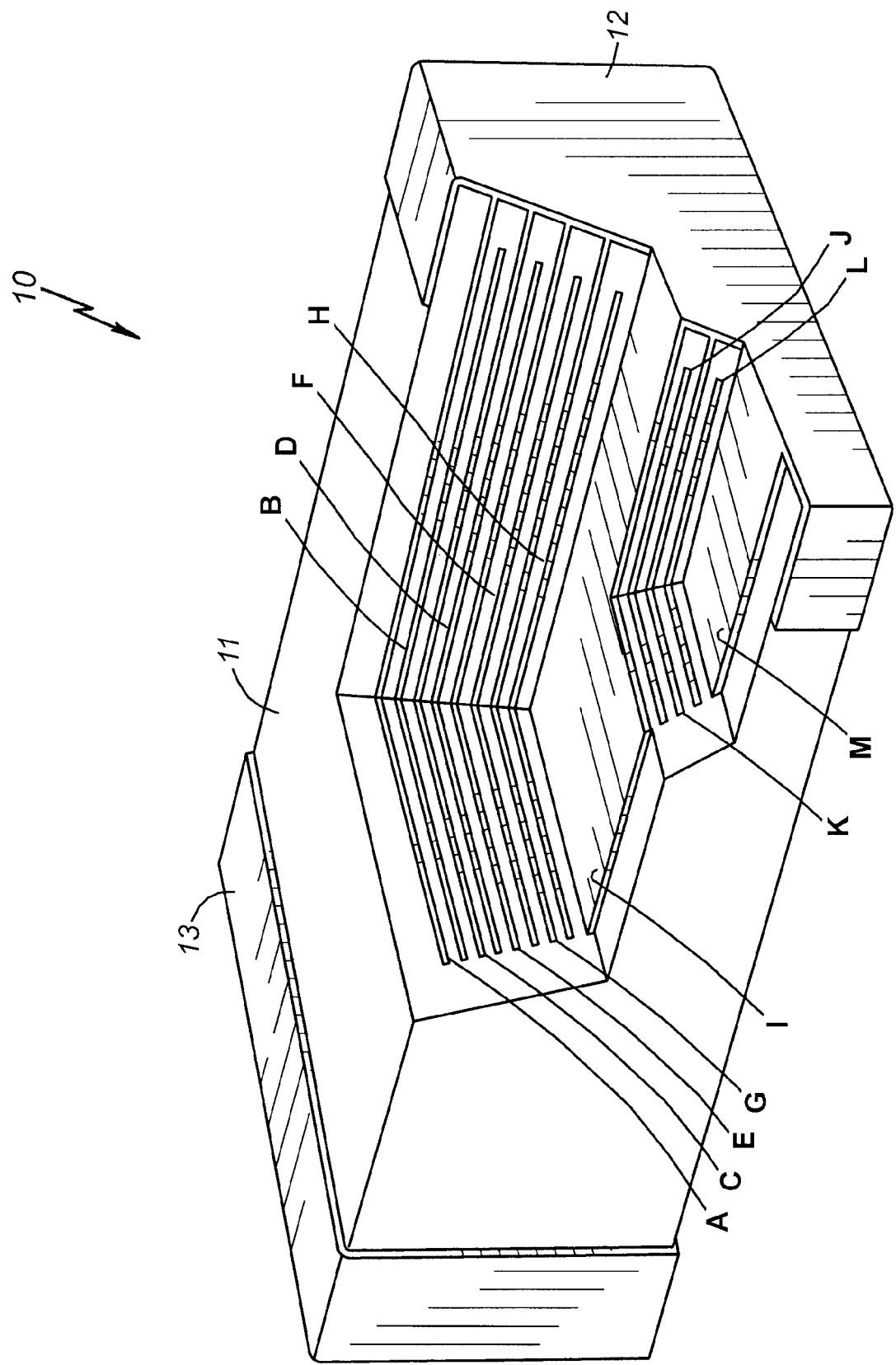
Fig. 1 - Prior Art

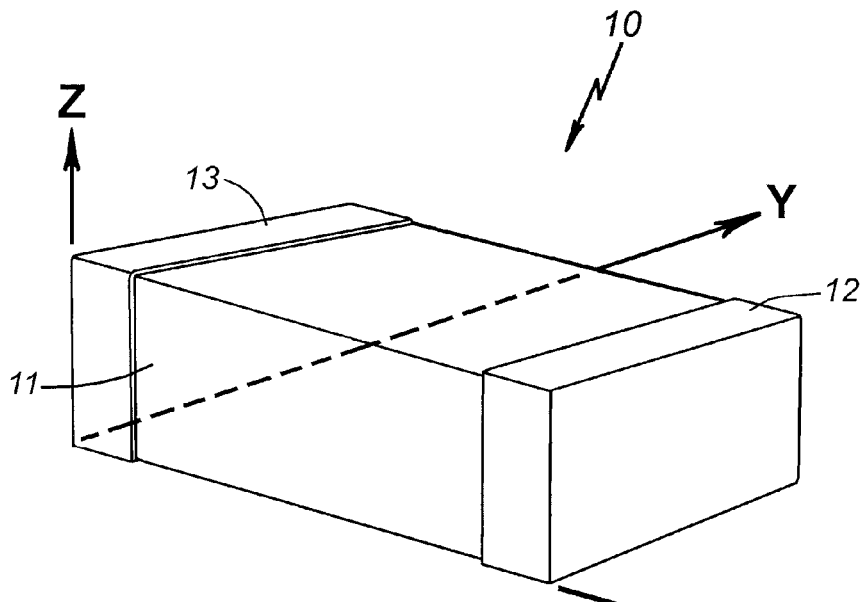
Fig. 2 - Prior Art
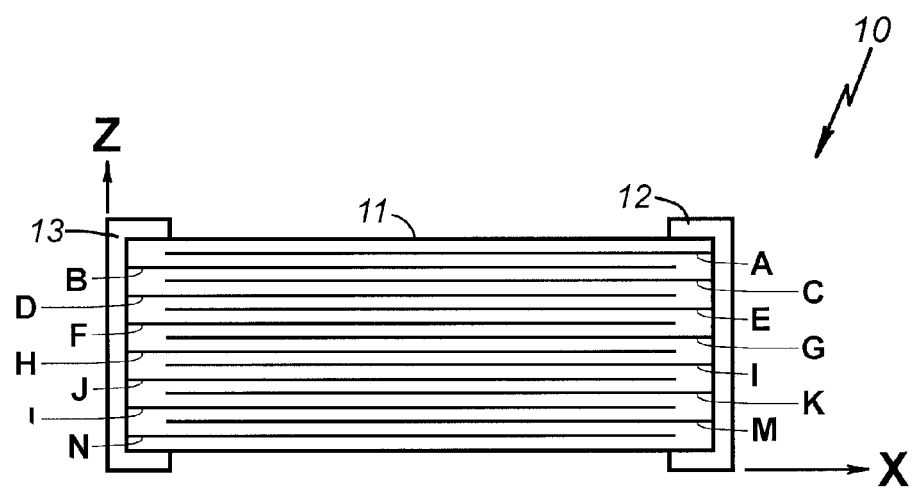
Fig. 3 - Prior Art
Fig. 4 - Prior Art

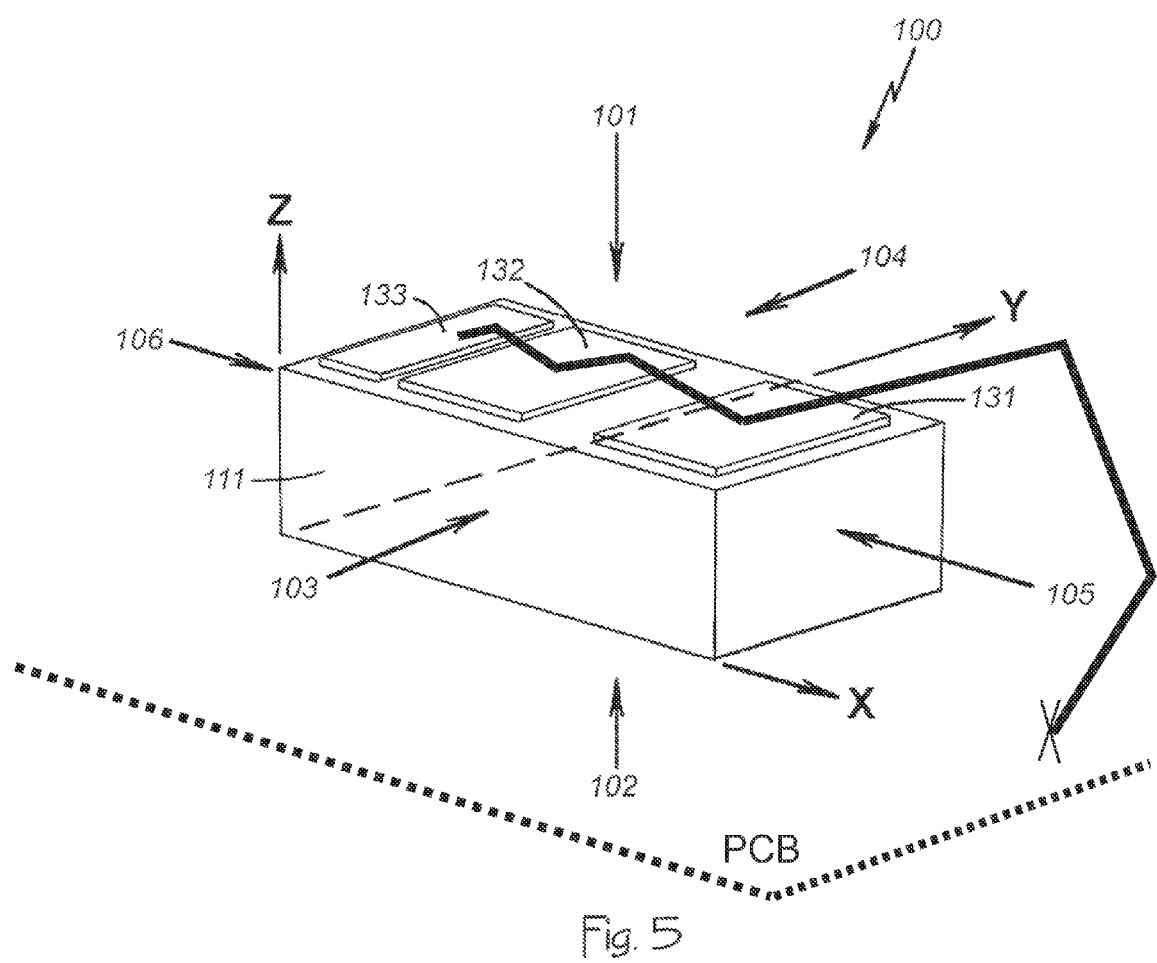

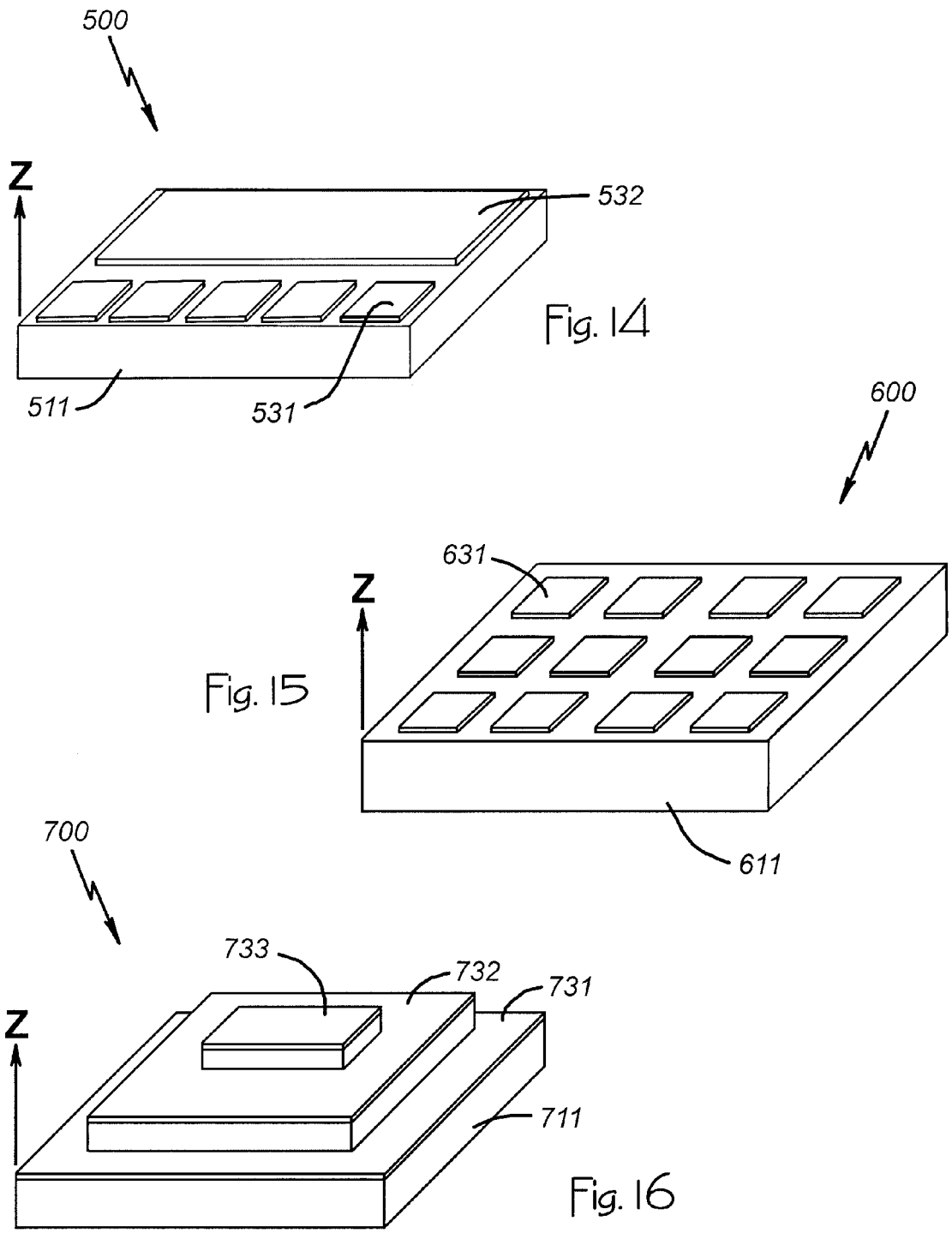

MINIATURE WIRE-BONDABLE CAPACITOR

CROSS REFERENCE TO RELATED APPLICATION

This application claims the benefit of U.S. Provisional Patent Application Ser. No. 61/726,997 filed Nov. 15, 2012, and the benefit of U.S. Provisional Patent Application Ser. No. 61/822,352 filed May 11, 2013.

BACKGROUND OF THE INVENTION

1. Technical Field

This invention relates generally to ceramic capacitors, and more particularly to a multi-layer ceramic capacitor (MLCC) device that provides more functionality while requiring less printed circuit board space.

2. Description of Related Art

A typical MLCC device is a tiny electronic component having spaced-apart capacitor electrodes in the form of electrically conductive layers embedded in interleaving and overlapping relationships within a ceramic chip. The manufacturer often produces batches of such devices using green dielectric ceramic tape on which a worker has printed the electrically conductive layers in desired patterns. After layering multiple pieces of the green dielectric tape into a single multi-layered sintered ceramic sheet, the worker dices the single sheet into multiple MLCC devices. Thereafter, the worker terminates the capacitor electrodes at opposite ends of each device with metallization or other electrically conductive material. The resulting MLCC devices typically have dimensions on the order of 10 mils to 120 mils wide and long by 4 mils to 60 mils thick (a mil being equal to one thousandth of an inch).

To mount such an MLCC device on a printed circuit board (PCB), an assembler connects the device terminals to landing pads on the PCB. The MLCC device has a bottom facing the PCB, an oppositely facing top, a front side, a back side, and oppositely facing left and right ends, with the device terminals being located on the left and right ends. The assembler typically uses well known reflow soldering and/or conductive epoxy techniques to provide both electrical and mechanical connections to the terminals. Although effective in some respects, connecting the device that way results in a loss of PCB space. The volume of solder between the capacitor terminals and the landing pad on the PCB (i.e., the "solder fillet") takes up room around the device. Space must be left between adjacent capacitors to allow placement on the PCB. Moreover, the PCB board is manufactured with extra space between the PCB landing pads so that the solder fillets do not interconnect and make unwanted connections between landing pads and components.

Previous attempts to alleviate space-related shortcomings of existing MLCC devices include using an MLCC array. The array includes multiple discrete capacitors that are printed together and sintered into one monolithic block. The capacitors are lined up next to each other in the device (side-by-side) and terminations are made on opposite ends of the capacitors using a striping machine or other method to print. Another method involves gluing discrete capacitors together with a drop of epoxy adhesive. Both of these methods require fewer devices on the PCB for a given number of capacitor components, and thus they reduce space. However, packing of the devices on a PCB is still limited by the proximity of the landing pads and the solder fillets required for a good bond to the PCB.

SUMMARY OF THE INVENTION

In view of the foregoing, it is a primary object of the present invention to alleviate the space-related concerns outlined above. The present invention achieves this objective by providing an MLCC device having a ceramic chip in which are embedded multiple electrically conductive layers that define multiple stacked capacitors. The multiple stacked capacitors are stacked vertically within the MLCC device (i.e., between the PCB-facing bottom side of the ceramic chip of the device and the oppositely facing top side) and they are connected with vias to wire-bondable pads on the top side of the ceramic chip, instead of requiring solder connections to terminals on the ends. The resulting wire-bondable, vertically stacked capacitors arrangement reduces the footprint of a given capacitor complement (i.e., the PCB area occupied) while avoiding the space requirements of solder fillets.

To paraphrase some of the more precise language appearing in the claims and further introduce the nomenclature used, an MLCC device constructed according to the invention includes a ceramic chip. The ceramic chip has a top side, a bottom side, a front side, a back side, a left end, and a right end, and the bottom side defines a reference plane (e.g., the X-Y plane of an XYZ Cartesian coordinate system). A first plurality of electrically conductive layers is embedded within the ceramic chip, extending transversely parallel to the reference plane. They form a first capacitor. A second plurality of electrically conductive layers is also embedded within the ceramic chip, extending transversely parallel to the reference plane. They form a second capacitor.

A plurality of electrically conductive pads located on the top side of the ceramic chip are oriented parallel to and facing away from the reference plane in order to function as a wire-bondable capacitor terminal. A plurality of vias are provided in the ceramic chip that connect each one of the electrically conductive pads to a respective one of the first and second capacitors. So constructed, the MLCC device enables electrical connection of the first and second capacitors to a printed circuit board by wire bonding to the plurality of electrically conductive pads on the top side, instead of requiring solder connections to terminals on the left and right ends. In addition, stacking the capacitors vertically that way, along the Z axis, results in a small footprint for a given number of capacitors. One embodiment includes metallization on the bottom side of the ceramic chip and on at least one of the left end and the right end that functions as a downwardly facing capacitor terminal. All of the conductive pads on the top side of the ceramic chip may lie in a common plane or be pyramidally arranged (i.e., at different levels relative to the Z axis).

In line with the foregoing, the present invention provides a method for mounting a multi-layered ceramic capacitor device on a PCB while saving board space. The method includes the step of providing an MLCC device as described above. It proceeds by mounting the device on the PCB with the bottom side of the ceramic chip facing the PCB and with the top side of the ceramic chip and the wire-bondable pad facing away from the PCB. Wire-bonding techniques are used to connect the wire-bondable pad to the PCB in that orientation.

Thus, the invention provides an MLCC structure and methodology that alleviate the space-related concerns outlined above, with a reduced footprint and avoidance of the solder fillets. The following illustrative drawings and detailed description make the foregoing and other objects, features, and advantages of the invention more apparent.

BRIEF DESCRIPTION OF THE DRAWINGS

FIG. 1 of the drawings is an orthographic pictorial of an MLCC device constructed according to the prior art, with portions broken away to expose the embedded capacitor electrodes;

FIG. 2 of the drawings is a reduced-in-size orthographic pictorial of the prior art MLCC device, with an XYZ Cartesian coordinate system identified for spatial reference purposes;

FIG. 3 is a diagrammatic elevation view of the prior art MLCC device, as viewed in a vertical bisecting plane;

FIG. 4 is a simplified equivalent circuit diagram of the prior art MLCC device;

FIG. 5 is an orthographic pictorial of the outline of an MLCC device constructed according to the present invention, shown in outline form for purposes of identifying the six sides that are referred to herein in describing the device;

FIG. 14 is a diagrammatic perspective view of a fifth embodiment of an MLCC device constructed according to the present invention, showing a first conductive pad arrangement;

FIG. 15 is a diagrammatic perspective view of a sixth embodiment of an MLCC device constructed according to the present invention, showing a second conductive pad arrangement;

FIG. 16 is a diagrammatic perspective view of a seventh embodiment of an MLCC device constructed according to the present invention, showing a third conductive pad arrangement;

DESCRIPTION OF THE PREFERRED EMBODIMENTS

Figure 6:
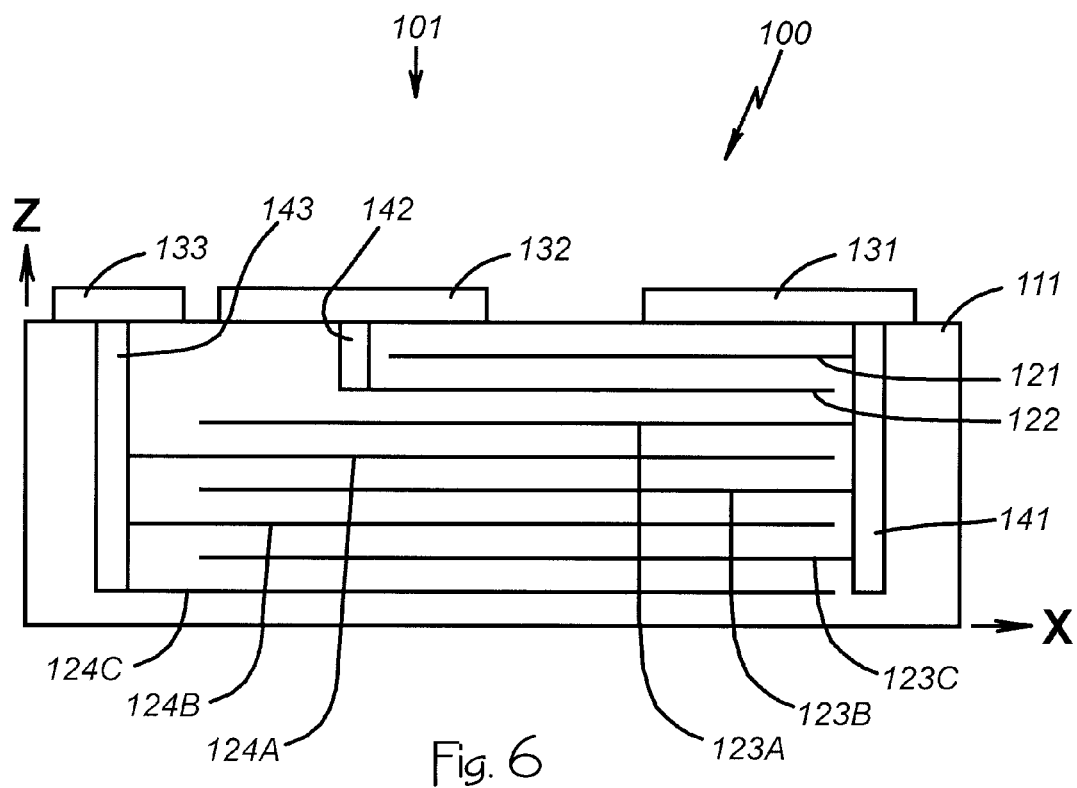
FIG. 6 is a diagrammatic cross section of the MLCC device of FIG. 5, as viewed in a bisecting plane extending transversely between the left and right ends of the ceramic chip parallel to the X-Z plane.

The following detail description incorporates by reference the information contained in U.S. Provisional Patent Application Ser. No. 61/726,997 filed Nov. 15, 2012, together with the information contained in U.S. Provisional Patent Application Ser. No. 61/822,352 filed May 11, 2013. The contents of those two provisional patent applications are hereby incorporated herein in their entirety by this reference for all the information provided.

First, consider FIGS. 1, 2, 3, and 4 of the drawings. They show an MLCC device 10 constructed according to the prior art. The prior art MLCC device 10 is included in this description of the present invention as a reference for some introductory comments about MLCC fabrication techniques. In addition, FIGS. 1-4 demonstrate some patent application illustration techniques that are used in several of the other drawing figures.

The MLCC device 10 includes a ceramic chip 11 in the form of a rectangular parallelepiped measuring, for example, about 10 mils to 50 mils wide and long by about 4 mils to 10 mils thick. The ceramic chip 11 includes a plurality of embedded electrically conductive layers A through N (FIGS. 1, 2, and 3) disposed in interleaving and overlapping relationships to each other (the layer N is only identified in FIGS. 2 and 3).

The embedded layers extend transversely through the ceramic chip 11, parallel to an X-Y plane (a reference plane) defined by an XYZ Cartesian coordinate system shown in the orthographic pictorial of FIG. 2 and the diagrammatic elevation view of FIG. 3. A first set of the electrically conductive layers forms a first capacitor electrode and a second set of the layers form a second capacitor electrode, resulting in two spaced-apart electrodes of a capacitor having characteristics dependent on the total overlapping area of the two electrodes, the spacing of the two electrodes, and the dielectric properties of the ceramic chip 11. Layers A, C, E, G, I, K, and M form the first capacitor electrode, and they are connected to an electrically conductive metallization 12 that functions as a first terminal for the MLCC device 10. Layers B, D, F, H, J, L, and N form the second capacitor electrode, and they are connective to an electrically conductive metallization 13 that functions as a second terminal. An equivalent circuit diagram for the MLCC device 10 is shown in FIG. 4.

The MLCC device 10 is fabricated in a known way using a series of thin sheets of green dielectric ceramic tape on which are printed the electrically conductive layers A-N. The series of sheets are assembled together in a known way to form a ceramic block, and the assembled ceramic block is then diced with a saw or by some other cutting method to form a batch of individual ceramic chips (e.g., the ceramic chip 11 of the device 10). Thereafter, metallization is added on the ends of the ceramic chips (e.g., the metallization 12 and 13 on the ceramic chip 11) to form the capacitor terminals. Further fabrication details are provided in U.S. Patent Publication No. 2012/0327554 published Dec. 27, 2012, and that publication is incorporated herein by this reference for all the information provided.

Figure 7:
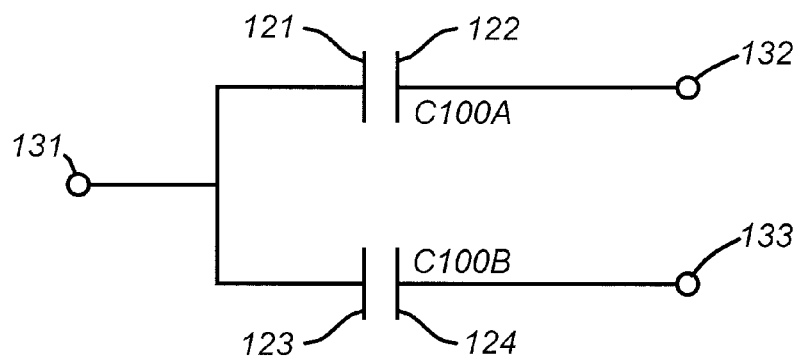
FIG. 7 is a simplified equivalent circuit diagram of the MLCC device of FIGS. 5 and 6.

Turning now to FIGS. 5, 6, and 7, they show various aspects of an MLCC device 100 constructed according to the present invention. FIG. 5 is an orthographic pictorial that identifies the six sides of the ceramic chip of the device 100. They include a top side 101, an oppositely facing bottom side 102, a front side 103, an oppositely facing back side 104, a left end 105, and an oppositely facing right end 106. The bottom side 102 of the ceramic chip of the device 100 lies in the X-Y plane of an XYZ Cartesian coordinate system (i.e., the bottom side defines a reference plane). It does so in the sense that when the bottom side 102 is set atop a horizontal support surface (e.g., an upwardly facing horizontal surface of a printed circuit board), the Z axis of the indicated XYZ Cartesian coordinate system is vertical, with the top side 101 facing upwardly away from that X-Y reference plane.

The device 100 includes a ceramic chip 111 (FIGS. 5 and 6) in which is embedded a plurality of conductive layers. The ceramic chip 111 may be similar in some respects to the prior art ceramic chip 11 described previously. It may have a similar overall size and shape, and it may be fabricated in a similar manner using green dielectric ceramic tape. The major differences lie primarily in (i) the number, placement, and pairing of the plurality of electrically conductive layers, (ii) the plurality of upwardly facing wire-bondable pads on the top side 101, (iii) the plurality of vias connecting the layers to the wire-bondable pads, and (iv) the resulting multi-capacitor equivalent circuit shown in FIG. 7.

As shown in the diagrammatic cross section of FIG. 6, the plurality of electrically conductive layers extend transversely within the ceramic chip 111, parallel to the X-Y plane of the XYZ Cartesian coordinate system. They include a first set 121 of electrically conductive layers (i.e., one or more layers), and a second set 122 of electrically conductive layers (i.e., one or more layers). Each of the first and second sets 121 and 122 for the illustrated device 100 have only one layer, although those sets of electrically conductive layers may have more than one layer within the broader inventive concepts disclosed. The first and second sets 121 and 122 function as spaced-apart, overlapping capacitor electrodes of a first capacitor C100A, as indicated by FIG. 7.

In a similar manner, the plurality of electrically conductive layers embedded within the ceramic chip 111 include a third set 123 of electrically conductive layers (FIG. 7) that are identified in FIG. 6 as electrically conductive layers 123A, 123B, and 123C. The plurality of electrically conductive layers also include a fourth set 124 of electrically conductive layers (FIG. 7) that are identified in FIG. 6 as electrically conductive layers 124A, 124B, and 124C. The third and fourth sets 123 and 124 function as spaced-apart, overlapping capacitor electrodes of a second capacitor C100B, as indicated by FIG. 7.

Upwardly facing wire-bondable pads are provided on the top side 101 of the device 100. They are identified in FIGS. 5 and 6 as a first pad 131, a second pad 132, and a third pad 133. They function as wire-bondable pads (i.e., terminals) for the first and second capacitors C100A and C100B as indicated in FIG. 7. They are wire-bondable pads in the sense that each is an electrically conductive pad of suitable size, shape, and composition for bonding to a wire using known wire-bonding techniques. The first, second, and third pads 131, 132, and 133 may be formed, for example, by printing them on a top sheet of the green dielectric ceramic tape mentioned previously.

First, second, and third vias 141, 142, and 143 are also provided, each via connecting a respective one of the first, second, and third pads 131, 132, and 133 to one or more of the capacitor electrodes 121, 122, 123, and 124 (i.e., the first, second, third, and fourth sets 121, 122, 123, and 124 of the plurality of electrically conductive layers). Thus, the via 141 connects the pad 131 to both the capacitor electrode 121 of the first capacitor C100A and the capacitor electrode 123 of the second capacitor C100B. The via 142 connects the second pad 132 to the capacitor electrode 122 of the first capacitor C100A, and the via 143 connects the pad 133 to the capacitor electrode 124 of the second capacitor C100B.

Fabrication of the MLCC device 100 may proceed according to the following outline:
1. Cast a series of thin sheets of green dielectric ceramic tape.
2. Punch alignment holes and via holes in the tape.
3. On one sheet of tape, screen print the top conductive pads, carefully aligning the pads to the via holes.
4. Flip the sheet over and tack it to a carrier block.
5. Fill the via holes and print the first electrically conductive layer.
6. Add another punched sheet of green ceramic tape, carefully aligning the via holes.
7. Offset the screen, or use a second screen, to print the opposing internal electrode. Also, fill the via.
8. Add another green sheet of dielectric tape as stated above in step 6.
9. Repeat steps 5 through 7 until the required number of electrically conductive layers has been printed.
10. Attach the final ceramic sheet.
11. Fill the vias, dry, and print the top conductive pads.
12. Optionally, laminate the ceramic assembly/block using a press. Sufficient pressure may have been obtained when stacking the ceramic sheets.
13. Dice the ceramic block with a saw or other cutting method that leaves a kerf.
14. Metallize the bottom pad and sized of the device, when such metallization and bottom pad are included.
15. Complete singulation of the devices, if needed, with further sawing/dicing, and remove the devices from the carrier block.
16. Sinter the ceramic, perform binder burn-out and firing of diced devices in a kiln.

The use of sacrificial material during the buildup of an MLCC device constructed according to the present invention allows for complex shapes to be made (e.g., pyramid or stepped capacitor). Such an arrangement can add to the ability to withstand voltage between capacitors within the device and create more room for multiple wire bonds. Other passive materials (i.e., inductors and resistors) may be printed on various embedded layers of the device during the green stage (in addition to or instead of one of the second capacitor already described) in order to thereby provide a stacked arrangement of passive components that add even more functionality to the device. Vias connect such passive components to upwardly facing wire-bondable pads on the top side of the ceramic chip of the device.

To use an MLCC device constructed according to the present invention, a user mounts it on a PCB using electrically conductive epoxy where there is a bottom conductive pad (i.e., metallization of the bottom side of the ceramic chip of the device) or electrically insulating epoxy where there is no bottom conductive pad. Connections to the pads on the top side of the ceramic chip of the device are then made using wire bonds.

Multiple wire bonds can be made to one pad when desired, the number of multiple bonds being limited by the size of the pad and the size of the wire bond. Different ones of the embedded capacitors can be included in any particular circuit by wire bonding to the different pads of the device.

Figure 8:
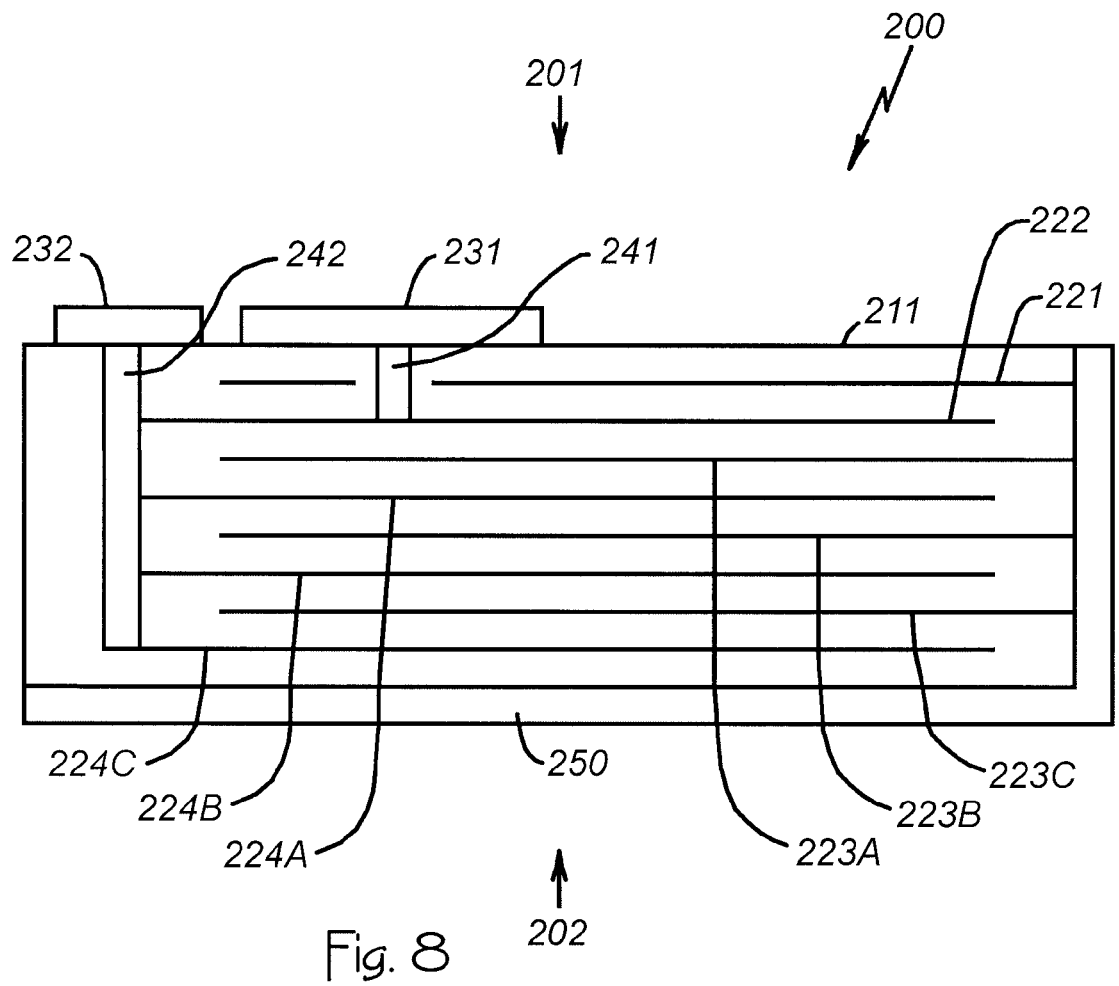
FIG. 8 is a diagrammatic cross section of a second embodiment of an MLCC device constructed according to the present invention.
Figure 9:
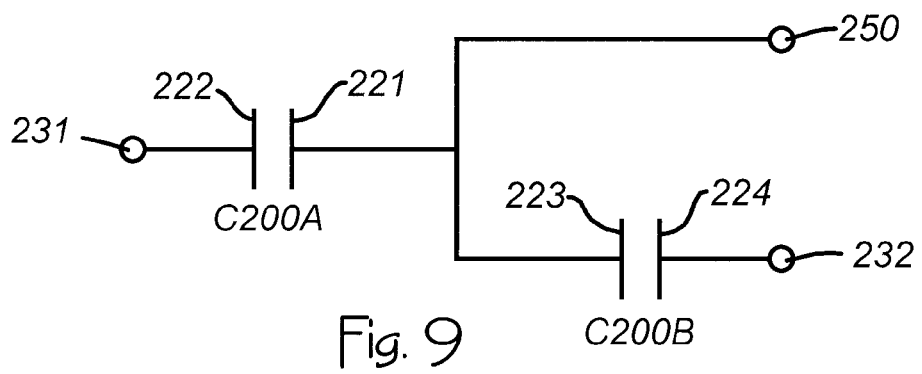
FIG. 9 is a simplified equivalent circuit diagram of the second embodiment of FIG. 8.

Now consider FIGS. 8 and 9. They show a second embodiment of an MLCC device constructed according to the invention that is identified as a device 200. The device 200 is similar in many respects to the device 100 and so only differences will be described in further detail. For convenience, reference numerals identifying many parts of the device 200 are increased by one hundred over those identifying similar, related, or associated parts of the device 100.

Similar to the MLCC device 100, the MLCC device 200 includes a plurality of electrically conductive layers embedded within a ceramic chip 211. The ceramic chip 211 may be similar in some respects to the ceramic chip 111, with a similar overall size and shape, and it may be fabricated in a similar manner using green dielectric ceramic tape. The major differences lie in (i) the number, placement, and pairing of the plurality of electrically conductive layers, (ii) the plurality of upwardly facing wire-bondable pads on the top side 201, (iii) the number of vias connecting the layers to the wire-bondable pads, (iv) the metallization along the bottom side 202 and the left end of the ceramic chip 211, and (v) the resulting multi-capacitor equivalent circuit shown in FIG. 9.

As shown in the diagrammatic cross section of FIG. 8, the plurality of electrically conductive layers extend transversely within the ceramic chip 211. They include a first set 221 of electrically conductive layers (i.e., one or more layers), and a second set 222 of electrically conductive layers (i.e., one or more layers). Each of the first and second sets 221 and 222 for the illustrated device 200 have only one layer, although those sets of electrically conductive layers may have more than one layer within the broader inventive concepts disclosed. The first and second sets 221 and 222 function as spaced-apart, overlapping capacitor electrodes of a first capacitor C200A, as indicated in FIG. 9.

In a similar manner, the plurality of electrically conductive layers embedded within the ceramic chip 211 include a third set 223 of electrically conductive layers (FIG. 9) that are identified in FIG. 8 as electrically conductive layers 223A, 223B, and 223C. The plurality of electrically conductive layers also includes a fourth set 224 of electrically conductive layers (FIG. 9) that are identified in FIG. 8 as electrically conductive layers 224A, 224B, and 224C. The third and fourth sets 223 and 224 function as spaced-apart, overlapping capacitor electrodes of a second capacitor C200B, as indicated in FIG. 9.

Metallization 250 along the bottom side 202 and the left end of the ceramic chip 211 functions as a first capacitor terminal that is common to the first and second capacitors C200A and C200B. The device 200 is mounted on a PCB by affixing that first capacitor terminal to the PCB using electrically conductive epoxy. First and second upwardly facing wire-bondable pads 231 and 232 on the top side 201 of the ceramic chip 211 of the device 200 function as first and second capacitor terminals, connected by first and second vias 241 and 242 to the capacitors C200A and C200B (there is no third pad corresponding to the third pad 133, nor a third via corresponding to the third via 143 of the device 100). In use, the first and second capacitor terminals of the device 200 are connected to the PCB by wire bonding.

Figure 10:
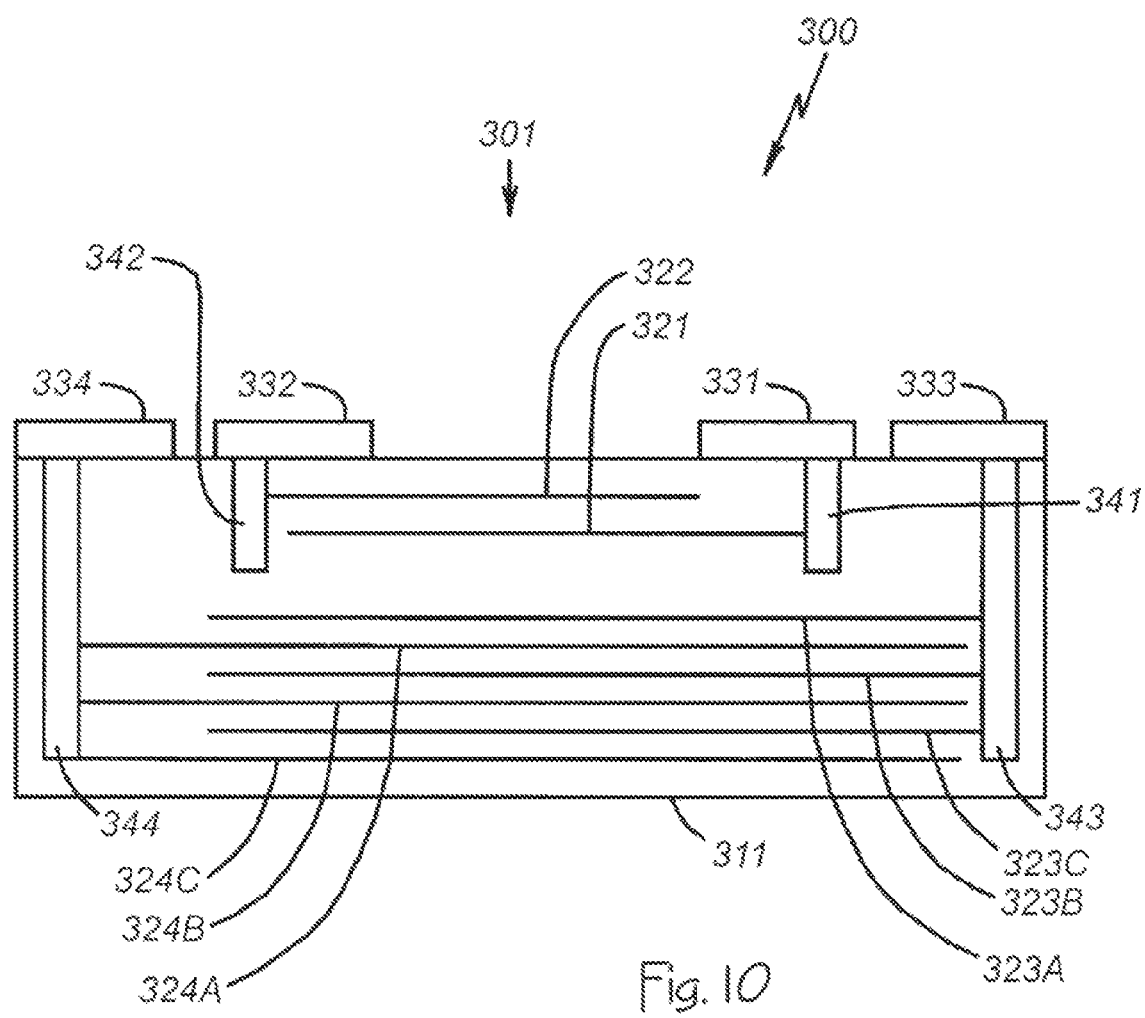
FIG. 10 is a diagrammatic cross section of a third embodiment of an MLCC device constructed according to the present invention.
Figure 11:
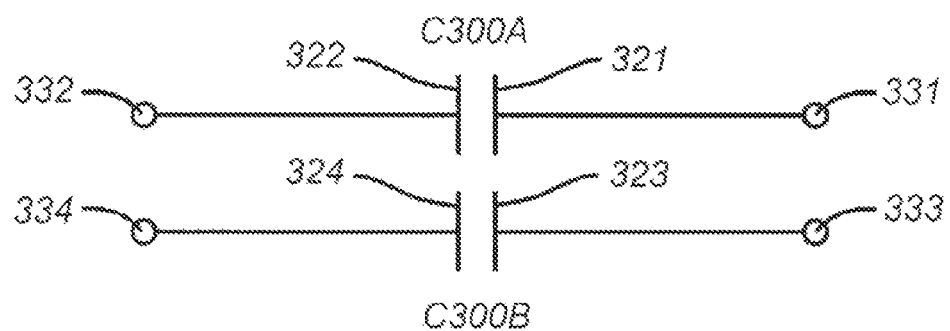
FIG. 11 is a simplified equivalent circuit diagram of the third embodiment of FIG. 10.

FIGS. 10 and 11 show a third embodiment of an MLCC device constructed according to the invention that is identified as a device 300. The device 300 is similar in many respects to the device 100 and so only differences will be described in further detail. For convenience, reference numerals identifying many parts of the device 300 are increased by two hundred over those identifying similar, related, or associated parts of the device 100.

Similar to the MLCC device 100, the MLCC device 300 includes a plurality of electrically conductive layers embedded within a ceramic chip 311. The ceramic chip 311 may be similar in some respects to the ceramic chip 111, with a similar overall size and shape, and it may be fabricated in a similar manner using green dielectric ceramic tape. The major differences lie in (i) the number, placement, and pairing of the plurality of electrically conductive layers, (ii) the four upwardly facing wire-bondable pads on the top side 301, (iii) the four vias connecting the layers to the wire-bondable pads, and (iv) the resulting two-separate-capacitors equivalent circuit shown in FIG. 11.

As shown in the diagrammatic cross section of FIG. 10, the plurality of electrically conductive layers extend transversely within the ceramic chip 311. They include a first set 321 of electrically conductive layers (i.e., one or more layers), and a second set 322 of electrically conductive layers (i.e., one or more layers). Each of the first and second sets 321 and 322 for the illustrated device 300 have only one layer, although those sets of electrically conductive layers may have more than one layer within the broader inventive concepts disclosed. The first and second sets 321 and 322 function as spaced-apart, overlapping capacitor electrodes of a first capacitor C300A, as indicated in FIG. 11.

In a similar manner, the plurality of electrically conductive layers embedded within the ceramic chip 311 include a third set 323 of electrically conductive layers (FIG. 11) that are identified in FIG. 10 as electrically conductive layers 323A, 323B, and 323C. The plurality of electrically conductive layers also include a fourth set 324 of electrically conductive layers (FIG. 11) that are identified in FIG. 10 as electrically conductive layers 324A, 324B, and 224C. The third and fourth sets 323 and 224 function as spaced-apart, overlapping capacitor electrodes of a second capacitor C300B, as indicated in FIG. 11.

First and second upwardly facing wire-bondable pads 331 and 332 on the top side 301 of the ceramic chip 311 of the device 300 function as first and second capacitor terminals, connected by first and second vias 341 and 342 to the electrodes of the capacitor C300A. In addition, third and fourth upwardly facing wire-bondable pads 333 and 334 on the top side 301 of the ceramic chip 311 device 300 function as third and fourth capacitor terminals, connected by third and fourth vias 343 and 344 to the electrodes of capacitor C300B. In use, the first, second, third, and fourth capacitor terminals of the device 200 (i.e., the wire-bondable pads 331, 332, 333, and 334) are connected to the PCB by wire bonding, with the device 300 thereby providing two separate and stacked capacitor components with a small footprint.

Figure 12:
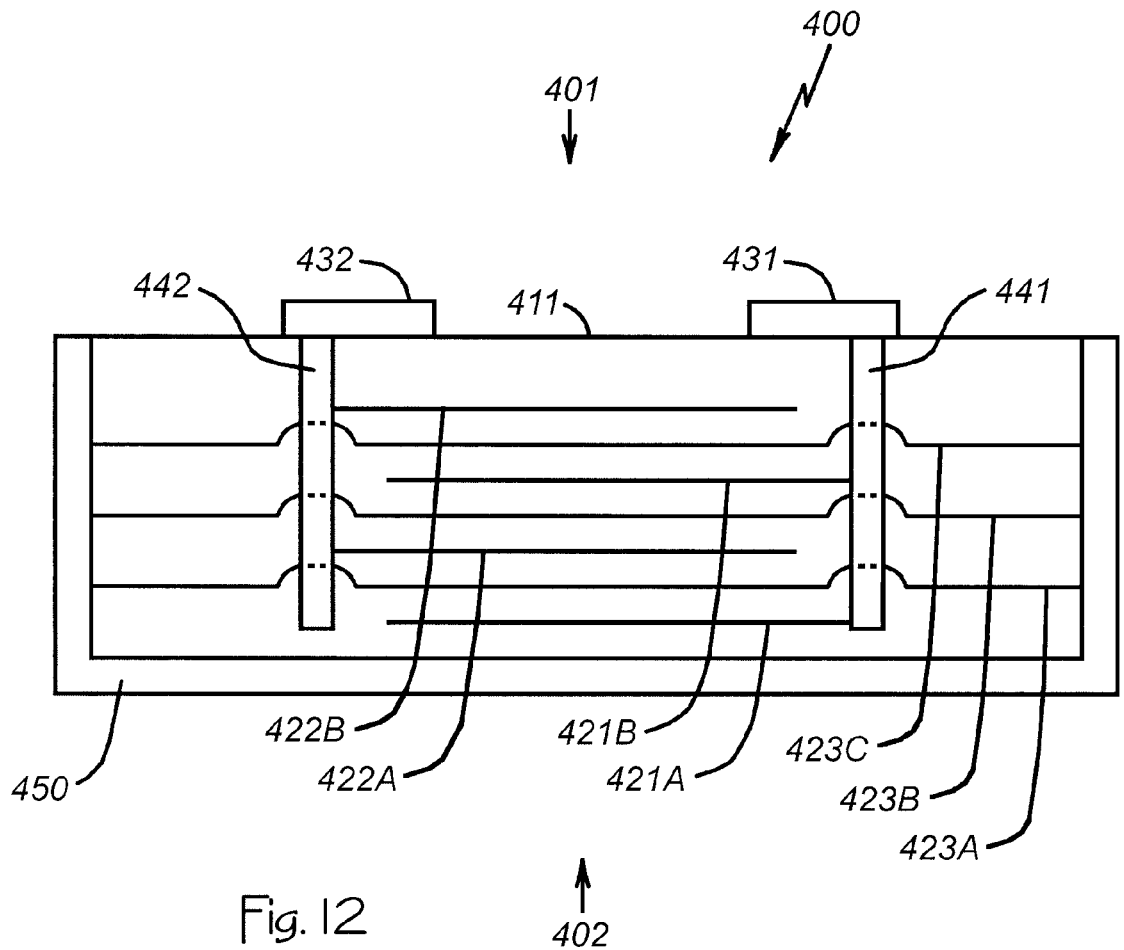
FIG. 12 is a diagrammatic cross section of a fourth embodiment of an MLCC device constructed according to the present invention.
Figure 13:
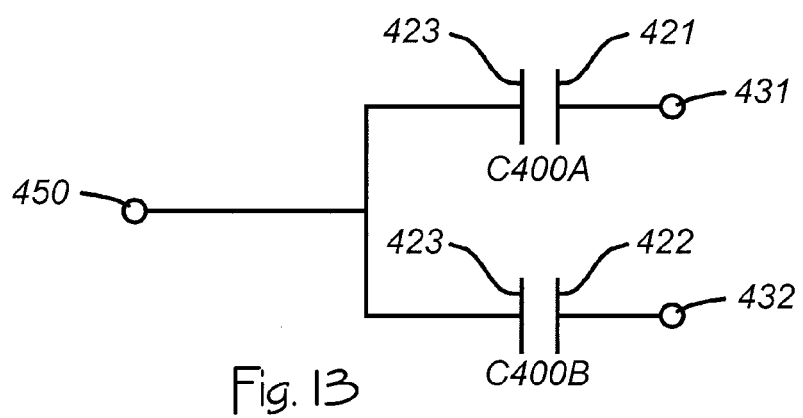
FIG. 13 is a simplified equivalent circuit diagram of the fourth embodiment of FIG. 12.

FIGS. 12 and 13 show a fourth embodiment of an MLCC device constructed according to the invention that is identified as a device 400. The device 400 is similar in many respects to the device 100 and so only differences will be described in further detail. For convenience, reference numerals identifying many parts of the device 400 are increased by three hundred over those identifying similar, related, or associated parts of the device 100.

Similar to the MLCC device 100, the MLCC device 400 includes a plurality of electrically conductive layers embedded within a ceramic chip 411. The ceramic chip 411 may be similar in some respects to the ceramic chip 111, with a similar overall size and shape, and it may be fabricated in a similar manner using green dielectric ceramic tape. The major differences lie in (i) the number, placement, and pairing of the plurality of electrically conductive layers, (ii) the two upwardly facing wire-bondable pads on the top side 401 of the ceramic chip 411, (iii) the two vias connecting the layers to the wire-bondable pads, (iv) the metallization along the bottom side 402 and the left and right ends of the ceramic chip 411, and (v) the resulting two-separate-capacitors equivalent circuit shown in FIG. 13.

As shown in the diagrammatic cross section of FIG. 12, the plurality of electrically conductive layers extend transversely within the ceramic chip 411. Those layers include a first set 421 (FIG. 13) of electrically conductive layers 421A and 421B (FIG. 12), a second set 422 (FIG. 13) of electrically conductive layers 422A and 422B (FIG. 12), and a third set 423 (FIG. 13) of electrically conductive layers 423A, 423B, and 423C (FIG. 12). The first and third sets 421 and 423 function as spaced-apart, overlapping capacitor electrodes of a first capacitor C400A, while the second and third sets 422 and 423 function as spaced-apart, overlapping capacitor electrodes of a second capacitor C400B, as indicated in FIG. 13.

First and second upwardly facing wire-bondable pads 431 and 432 on the top side 401 of the ceramic chip 411 of the device 400 function as first and second capacitor terminals, connected by first and second vias 441 and 442 to associated ones of the electrodes of the capacitors C400A and C400B. Metallization 450 along the bottom side 402 and the left and right ends of the ceramic chip 411 functions as a third capacitor terminal that is common to the first and second capacitors C400A and C400B. The device 400 is mounted on a PCB by affixing that third capacitor terminal to the PCB using electrically conductive epoxy. The first and second upwardly facing wire-bondable pads 431 and 432 on the top side 401 of the ceramic chip 411 function as first and second capacitor terminals, connected by first and second vias 441 and 442 to the capacitors C400A and C400B. In use, the first and second capacitor terminals of the device 400 (i.e., the first and second wire-bondable pads 431 and 432) are connected to the PCB by wire bonding. Notice that the curved portions of the layers 423A, 423B, and 423C next to the vias 441 and 442 in FIG. 12, and the dashed lines through the vias, are just diagrammatic ways of indicating that those layers do not electrically contact the vias. Enlarge areas of no electrically conductive layer at the indicated locations result in the layers being set back from (i.e., spaced apart from) the vias.

FIGS. 14, 15, and 16 illustrate some upwardly facing wire-bondable pad layouts for three MLCC devices that are identified as MLCC devices 500, 600, and 700. A first pad 531 of multiple wire-bonding pads on the ceramic chip 511 of the device 500 illustrates a smaller size pad for one wire-bonding connection, while a second pad 532 illustrates a larger pad for multiple wire-bonding connections. An even greater number of wire-bonding pads may be provided, as illustrated by a first pad 631 of twelve wire-bonding pads on the ceramic ship 611 of the device 600. The device 700 includes pyramidally deployed (stepped) pads 731, 732, and 733 on the ceramic chip 711 that lie in vertically spaced apart planes along the Z-axis.

Figure 17:
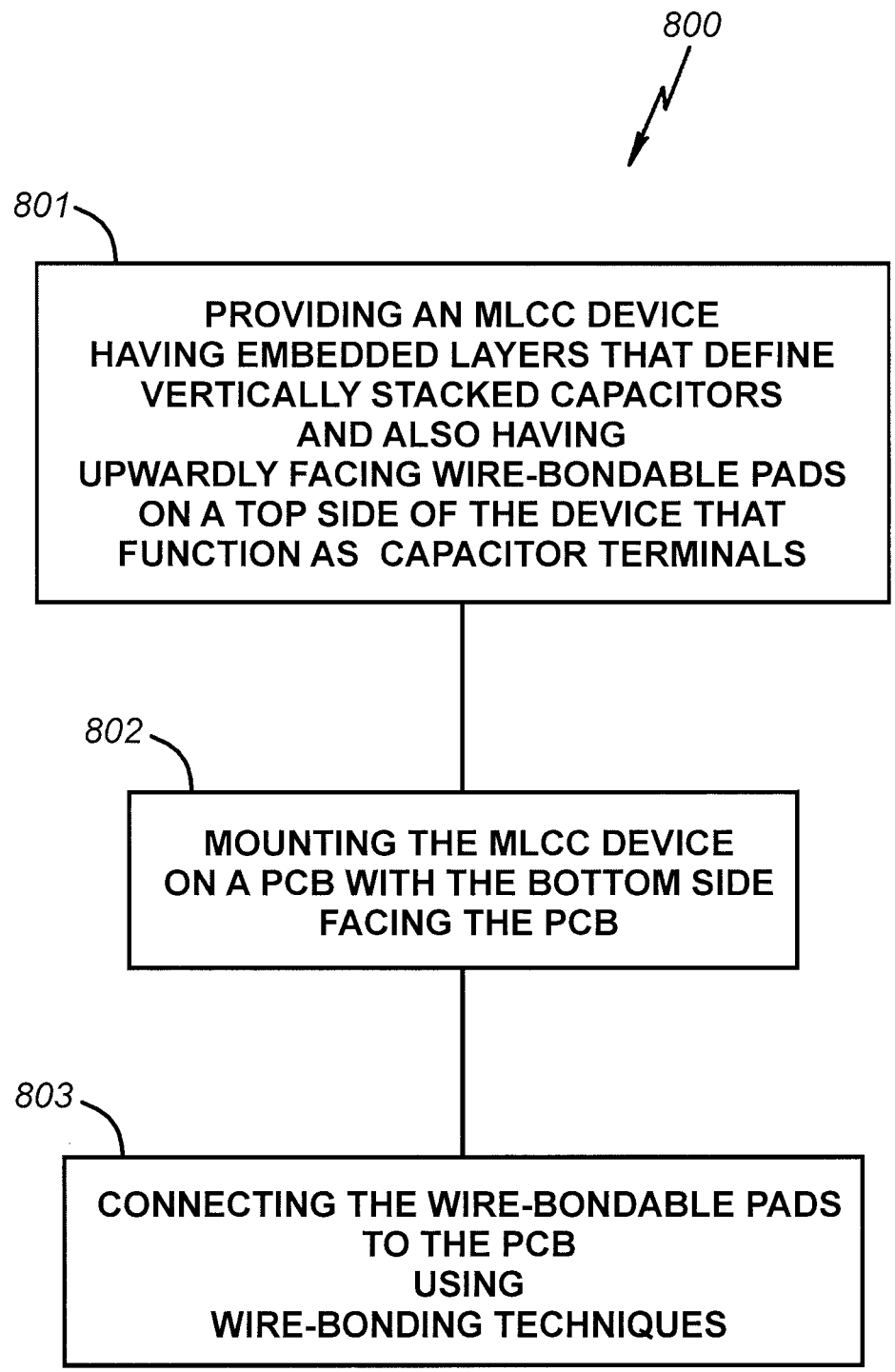
FIG. 17 is a block diagram of the method steps for saving space on a PCB.

FIG. 17 is a block diagram 800 of the steps involved in saving PCB space according to the methodology of the present invention. A method for mounting a multi-layered ceramic capacitor device on a printed circuit board while saving printed circuit board space includes the step shown in a block 801 of FIG. 17 of proving an MLCC device as described above (i.e., a device having a ceramic chip in which are embedded layers that define vertically stacked capacitors and also having upwardly facing wire-bondable pads on a top side of the ceramic chip device that function as capacitor terminals). The method proceeds by mounting the MLCC device on a PCB with the bottom side of the ceramic chip of the device facing the PCB, as shown in a block 802 FIG. 17, and by connecting the wire-bondable pads to the PCB using wire-bonding techniques. The step of mounting the MLCC device on a PCB may include bonding metallization on the bottom side of the ceramic chip to the PCB using, for example, an electrically conductive epoxy, as shown in a block 803 of FIG. 17. Based upon the foregoing description and the claims, a person having ordinary skill in the art can readily implement an MLCC device constructed according to the present invention and practice the method steps stated above.

Figure 18:
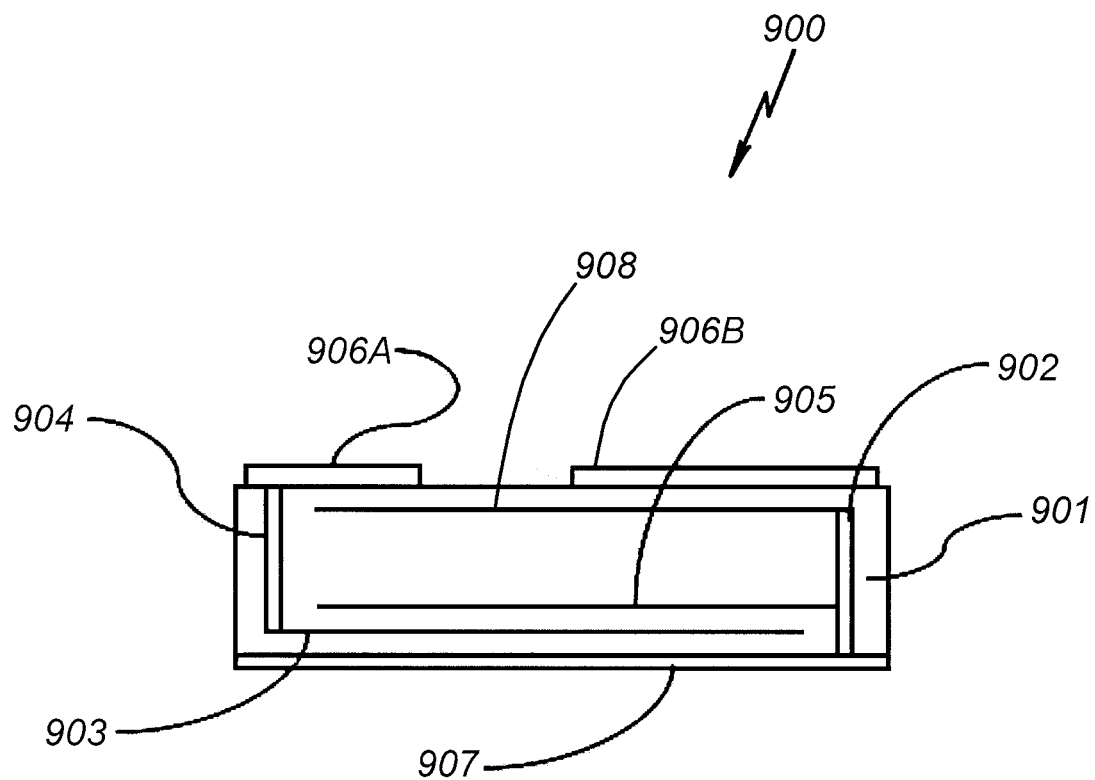
FIG. 18 is a diagrammatic cross section of yet another embodiment of an MLCC device constructed according to the present invention that includes multiple capacitors connected by vias to a top pad and a bottom pad.

FIG. 18 shows yet another embodiment of an MLCC device constructed according to the invention that is identified as a device 900. The device 900 includes a ceramic chip 901 in which are embedded first and second electrically conductive layers 903 and 905 that form a first capacitor. A first via 902 connects the second electrically conductive layer 905 to an electrically conductive bottom pad 907, while a second via 904 connects the first electrically conductive layer 903 to a first electrically conductive top pad 906A. An additional electrically conductive layer 908 embedded within the ceramic chip 901 forms a second capacitor with a second top pad 906B. The additional electrically conductive layer 908 is connected to the second electrically conductive layer 905 (and the bottom pad 907) by the first via 902.

Thus, the invention provides an MLCC structure and related methodology that alleviate the space-related concerns associated with prior art devices, with a reduced footprint and avoidance of solder fillets. Although exemplary embodiments have been shown and described, a person having ordinary skill in the art may make many changes, modifications, and substitutions without necessarily departing from the spirit and scope of the invention. As for the specific terminology used to describe the exemplary embodiments, it is not intended to limit the invention; each specific term is intended to include all technical equivalents that operate in a similar manner to accomplish a similar purpose or function. The terms "upwardly facing" and the like, for example, refer to spatial orientation when the bottom sides of the MLCC devices are set upon a horizontal support surface (e.g., the a horizontally disposed surface of a PCB).

What is claimed is:

1. A multi-layer ceramic capacitor device, comprising:
a ceramic chip having a top side, a bottom side, a front side, a back side, a left end, and a right end, said bottom side defining a reference plane;
a first plurality of electrically conductive layers embedded within the ceramic chip that form a first capacitor, each of said first plurality of electrically conductive layers extending transversely within the ceramic chip parallel to the reference plane;
a second plurality of electrically conductive layers embedded within the ceramic chip that form a second capacitor, each of said second plurality of electrically conductive layers extending transversely within the ceramic chip parallel to the reference plane;
wherein:
the first plurality of electrically conductive layers includes a first set of electrically conductive layers and a second set of electrically conductive layers, said first set of electrically conductive layers being electrically interconnected to form a first electrode of the first capacitor, and said second set of electrically conductive layers being electrically interconnected to form a second electrode of the first capacitor; and
the second plurality of electrically conductive layers includes a third set of electrically conductive layers and a fourth set of electrically conductive layers, said third set of electrically conductive layers being electrically interconnected to form a first electrode of the second capacitor, and said fourth set of electrically conductive layers being electrically interconnected to form a second electrode of the second capacitor;
the first capacitor includes at least one electrically conductive layer that is non-coplanar with any other electrically conductive layer of the second capacitor;
a plurality of electrically conductive pads on the top side of the ceramic chip, each of the plurality of electrically conductive pads having a flat surface that is parallel to and at a distance away from the top side, and being otherwise configured to function as a wire-bondable capacitor terminal; and a plurality of vias in the ceramic chip, each of the plurality of vias connecting a respective one of the plurality of electrically conductive pads to a respective one of the first and second capacitors;
wherein at least one via does not extend from the top side to the bottom side;
wherein at least one of the electrically conductive pads is not connected to any via that extends into the ceramic chip and is disposed proximate one of the plurality of electrically conductive layers embedded within the ceramic chip so as to form an additional capacitor;
whereby the multi-layer ceramic capacitor device enables electrical connection of the first and second capacitors to a printed circuit board by wire bonding to the plurality of electrically conductive pads on the top side instead of requiring solder connections to terminals on the left and right ends.

2. A multi-layer ceramic capacitor device as recited in claim 1, further comprising metallization on the bottom side of the ceramic chip and on at least one of the left end and the right end, which metallization is electrically connected to the first capacitor.

3. A multi-layer ceramic capacitor device as recited in claim 1, wherein all of the conductive pads of the plurality of conductive pads on the top side of the ceramic chip lie in a common plane.

4. A multi-layer ceramic capacitor device as recited in claim 1, wherein all of the conductive pads of the plurality of conductive pads on the top side of the ceramic chip do not lie in a common plane.

5. A multi-layer ceramic capacitor device as recited in claim 1, wherein the first electrode of the first capacitor is electrically connected to the first electrode of the second capacitor and to one of the plurality of electrically conductive pads on the top side of the ceramic chip.

6. A multi-layer ceramic capacitor device as recited in claim 1, wherein the first electrode of the first capacitor is electrically connected to the first electrode of the second capacitor and to metallization on the bottom side of the ceramic chip.

7. A method for mounting a multi-layered ceramic capacitor device on a printed circuit board while saving printed circuit board space, the method comprising:
providing a multi-layered ceramic capacitor device having a ceramic chip with a top side and an oppositely facing bottom side that defines a reference plane, said device including a plurality of electrically conductive layers embedded within the ceramic chip that extend transversely parallel to the reference plane in spaced-apart relationship to each other in a direction perpendicular to the reference plane in order to form passive electronic components in the form of first and second capacitors that are in parallel, wherein the first capacitor includes at least one electrically conductive layer that is non-coplanar with any other electrically conductive layer of the second capacitor, said device including at least a first wire-bondable pad on the top side of the ceramic chip that is electrically connected with a via to the first capacitor, and said device further including at least a second wire-bondable pad on the top side of the ceramic chip that is not electrically connected to any via that extends into the ceramic chip and that is disposed proximate one of the plurality of electrically conductive layers embedded within the ceramic chip so as to form an additional capacitor;
mounting the multi-layer ceramic capacitor device on the printed circuit board with the bottom side of the ceramic chip facing the printed circuit board and with the top side of the ceramic chip and the wire-bondable pad facing away from the printed circuit board; and
connecting the wire-bondable pad to the printed circuit board using wire-bonding techniques.

8. A method as recited in claim 7, wherein the step of mounting the multi-layer ceramic capacitor device on the printed circuit board includes bonding metallization on the bottom side of the ceramic chip to the PCB.

9. A multi-layer ceramic capacitor device, comprising:
a ceramic chip having a top side, a bottom side, a front side, a back side, a left end, and a right end, said bottom side defining a reference plane;
first and second electrically conductive layers embedded within the ceramic chip that form a first capacitor, the first electrically conductive layer being connected by a first via to a first top pad on the ceramic chip and the second electrically conductive layer being connected by a second via to a bottom pad on the ceramic chip;
wherein the top pad has a flat surface that is parallel to and at a distance away from the top side, and is otherwise configured to function as a wire-bondable capacitor terminal;
wherein at least one via does not extend from the top side to the bottom side;
an additional electrically conductive layer embedded within the ceramic chip that forms a second capacitor with a second top pad on the ceramic chip, said additional electrically conductive layer being connected by the second via to the second electrically conductive layer;
wherein the second top pad is not connected to any via that extends into the ceramic chip.

* * * * *